FIG. I

*INVENTOR.*
ARTHUR H. DE PUY
*BY* Willis E. Higgins
ATTORNEY

FIG. 2
PRIOR ART
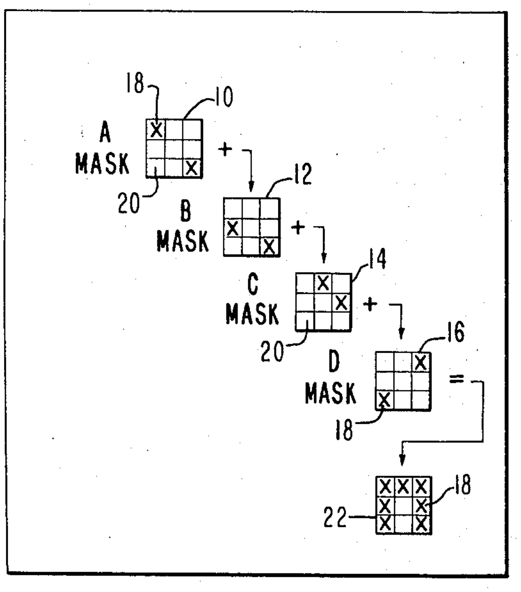
FIG. 3
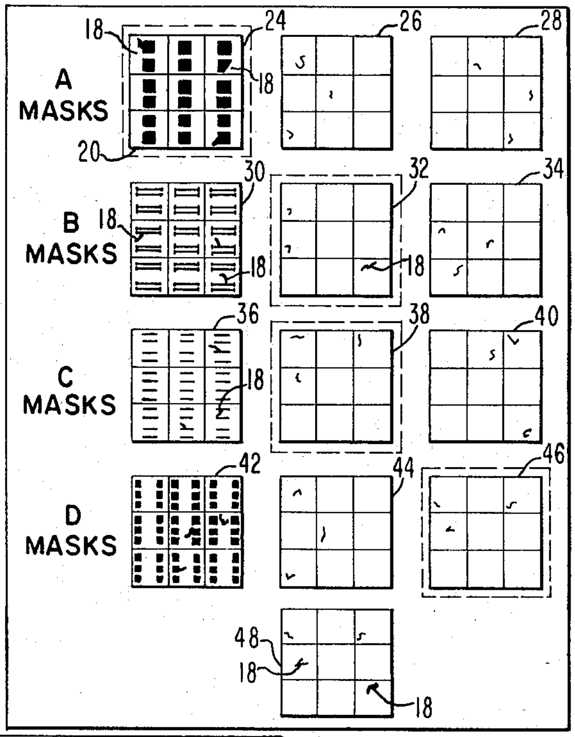
| A MASKS | B MASKS | C MASKS | D MASKS | NO OF DEFECTS |
|---|---|---|---|---|
| 24 | 30 | 36 | 42 | 7 |
| 24 | 32 | 38 | 46 | 4 |
| 26 | 32 | 40 | 44 | 7 |
| 28 | 34 | 40 | 46 | 8 |
| 28 | 30 | 38 | 42 | 7 |
| 26 | 30 | 36 | 44 | 8 |
| 28 | 32 | 38 | 44 | 8 |
| 24 | 30 | 32 | 46 | 5 |
| 26 | 34 | 36 | 44 | 7 |
| 28 | 32 | 36 | 42 | 8 |
ETC.
FIG. 4

United States Patent Office 3,598,604
Patented Aug. 10, 1971

3,598,604
PROCESS OF PRODUCING AN ARRAY OF INTEGRATED CIRCUITS ON SEMICONDUCTOR SUBSTRATE

Arthur H. De Puy, Essex Center, Vt., assignor to International Business Machines Corporation, Armonk, N.Y.

Filed Nov. 19, 1968, Ser. No. 777,011
Int. Cl. G03c 5/04
U.S. Cl. 96—36.2 8 Claims

ABSTRACT OF THE DISCLOSURE

Yield in semiconductor manufacturing processes wherein a plurality of masks are used for different processing steps to expose photoresist in arrays of patterns for semiconductor circuits on a wafer may be maximized by overlaying defects in the masks. This may be done by combining one mask for each processing step in various combinations, then selecting the combination for use which will minimize the number of defective integrated circuits in the array.

FIELD OF THE INVENTION

This invention relates to processes for manufacturing integrated circuits, and to similar processes wherein an array of patterns is produced by a plurality of processing steps on a substrate. More particularly, it relates to a method for reducing the number of defective integrated circuits or patterns in arrays produced by such processes.

DESCRIPTION OF THE PRIOR ART

Processes for producing an array of patterns, such as integrated circuits, on a substrate, such as a semiconductor wafer, using a plurality of masks having an array of patterns in a series of processing steps, are well known. Agusta et al., application Ser. No. 539,210, now U.S. Pat. 3,508,209, filed Mar. 31, 1966, entitled "Monolithic Integrated Structure Including Fabrication and Package Therefor," assigned to the same assignee as the present application, discloses such a process. In such processes, a semiconductor wafer having an oxidized surface or other substrate is coated with photoresist, the photoresist is exposed through a mask having an array of patterns, the exposed photoresist is developed, and a pattern is etched to remove oxide in the wafer on those areas where the photoresist is not exposed. An impurity may then be diffused into the unoxidized semiconductor material exposed by the etching step. The process disclosed in the Agusta et al. application is used to produce an array of highly complex, closely spaced, integrated circuits on a semiconductor wafer.

In the production of such patterns on a substrate in this manner, defects in the masks are reproduced on the substrate. Such defects occur in a random fashion on the masks. These defects may be scratches on the masks, photoresist that was not removed in fabrication of the mask itself, areas of the mask where photoresist was removed where it should not have been removed, or other imperfections.

Even if most of the patterns in the array on each mask do not contain a defect, randomly occurring defects will produce defective patterns in most of the array if seven or eight masking steps are used to produce the array of patterns. For example, if 80 percent of the patterns in the array on each mask are defect free, randomly occurring defects on the patterns in the masks will reduce the maximum possible yield of patterns containing no defects obtained by using such masks in a process that requires eight different masking operations to about 17 percent. This yield figure assumes that no additional defects in the patterns will be produced by any other cause than defects in the masks. With an increased number of different masking steps, the maximum possible yield decreases exponentially. Semiconductor manufacturing processes involving, for example, 25 different masking steps therefore cannot be carried out on a practical basis unless something is done to reduce the number of defective integrated circuits produced by these randomly occuring mask defects.

U.S. Pat. 3,317,320, issued May 2, 1967, discloses one proposed solution for the problem of random mask defects. In the process there disclosed, two different masks having the same predetermined pattern are employed for each masking step required, either with or without the application of an additional layer of photoresist between the application of the two masks. While the array of predetermined patterns is the same on these two masks, the random distribution of defects is different.

This process reduces the effect of random mask defects, but it doubles the number of masking operations that must be carried out in a semiconductor manufacturing process which employs it. Additionally, the second mask having the same array of predetermined patterns must be registered very precisely in alignment with the image produced by the first mask.

Another proposed solution for the problem of random mask defects is touching up the masks themselves to correct them, as disclosed in commonly assigned U.S. Pat. 3,385,702 to Koehler, issued May 28, 1968. This approach, although very useful with some masks, is difficult to carry out when the patterns are very small and closely spaced, as in the case of present day monolithic integrated circuits on semiconductor wafers.

Another possible approach to the problem of random mask defects is to use higher quality masks. However, masks having even twenty percent of the integrated circuits in their arrays containing defects are very difficult to make, even with the very best mask fabrication technology. With the present state of mask fabrication technology, this approach is not practical.

A further problem in the prior art is the fact that a great deal of difficulty has been encountered in determining whether an apparent mask defect will in fact cause a defective integrated circuit at the array position containing the defect. Defective integrated circuits are often produced by mask defects which appear to be so slight as to cause no problem. Non-defective integrated circuits are at times produced at array positions containing apparently serious mask defects. Therefore, a manufacturing process which can maintain identification of mask locations in the array is needed. This information and the yield of nondefective integrated circuits from array locations containing possible defects in one or more of the masks would be very valuable in determining proper criteria for classifying particular circuit patterns on the masks as defective in fact. A related use of this information would be to determine whether defective circuits in an array are caused by mask defects or by the manufacturing process itself.

Thus, a serious problem exists in reducing the effect of randomly occurring mask defects on integrated circuit yields in processes requiring a plurality of masking steps. Further, a serious problem exists in the lack of ability to characterize accurately given integrated circuit patterns on masks as in fact defective.

SUMMARY OF THE INVENTION

Accordingly, it is an object of this invention to increase the number of defect free positions in an array of patterns produced on a substrate by a process involving the use of a plurality of masks, without increasing the number of masking steps or the quality of the masks used.

It is another object of this invention to maintain an acceptable yield of defect free positions in an array of patterns produced on a substrate by a process involving the use of a plurality of masks while using lower quality masks, without increasing the number of masking steps used.

It is another object of this invention to provide information on possibly defective circuits in an array of circuits on a semiconductor wafer produced by a plurality of masking steps with masks having possibly defective locations, to determine whether the possibly defective locations on the masks are in fact defective.

It is yet another object of this invention to provide a way of determining whether defects in integrated circuits of an array produced by a series of process steps involving the use of a plurality of masks are caused by the process or by defects in the masks used.

These and other related objects may be attained by employing the mask matching process herein disclosed. Broadly stated, the present invention is an improvement in a process for producing an array of pattern areas on a substrate using a plurality of masks in sets to define portions of the pattern areas in a plurality of successive processing steps. In accordance with the invention, the location of defects in the array of pattern areas in the masks of the sets is determined. The location of the defects in masks for the successive processing steps is compared. A combination of masks for the processing steps which maximizes the total number of defect-free pattern areas produced by the successive processing steps is selected. Use of the invention results in overlaying defects in the same pattern areas in the array, as far as possible. While a perfect overlay of defects is hardly ever accomplished, the number of pattern areas in the array containing no defects is greatly increased over that obtained using the masks without attempting to match their defect locations.

More specifically, in carrying out the invention, an inventory of masks is made for each set suitable for one of the successive processing steps used to make the array of patterns on the substrate. These masks are inspected to determine the location of defects on them. The location of the mask defects is recorded on a suitable medium. The location of the mask defects in masks for the plurality of processing steps is compared using the recorded location of the defects. Based on the comparison, a combination of one mask for each of the plurality of processing steps is selected which will minimize the number of defective integrated circuits in the array.

For processes involving a small number of masks in each set and a small number of processing steps, the defect locations in the individual masks may be recorded on cards. The cards may be arranged in different combinations to determine which mask combinations produce the fewest number of defective integrated circuits. For sets containing a large number of masks and/or for manufacturing processes having many successive processing steps, a computer may be used to record and compare the location of the mask defects.

The process of this invention is particularly suited for the manufacture of an array of integrated circuits on a semiconductor wafer. The effect of random defects in masks used for successive processing steps in the manufacture of integrated circuits is particularly severe. Also, using the mask matching process to determine whether a mask defect is substantial enough to make an integrated circuit containing the defect inoperable gives the invention particular value in the manufacture of integrated circuit devices. However, the education in the total number of defective patterns in an array produced using a plurality of masking steps makes the invention suitable for use in essentially any process requiring successive masking steps to produce an array of patterns on essentially any substrate.

The foregoing and other objects, features, and advantages of the invention will be apparent from the following more particular description of the preferred embodiments of the invention, as illustrated in the accompanying drawings.

BRIEF DESCRIPTION OF THE DRAWINGS

In the drawings:

FIG. 2 is a representation of the prior art random selection of masks;

FIGS. 3 and 4 depict the selection of a combination of masks in accordance with the invention;

DESCRIPTION OF THE PREFERRED EMBODIMENTS

Figure 1:
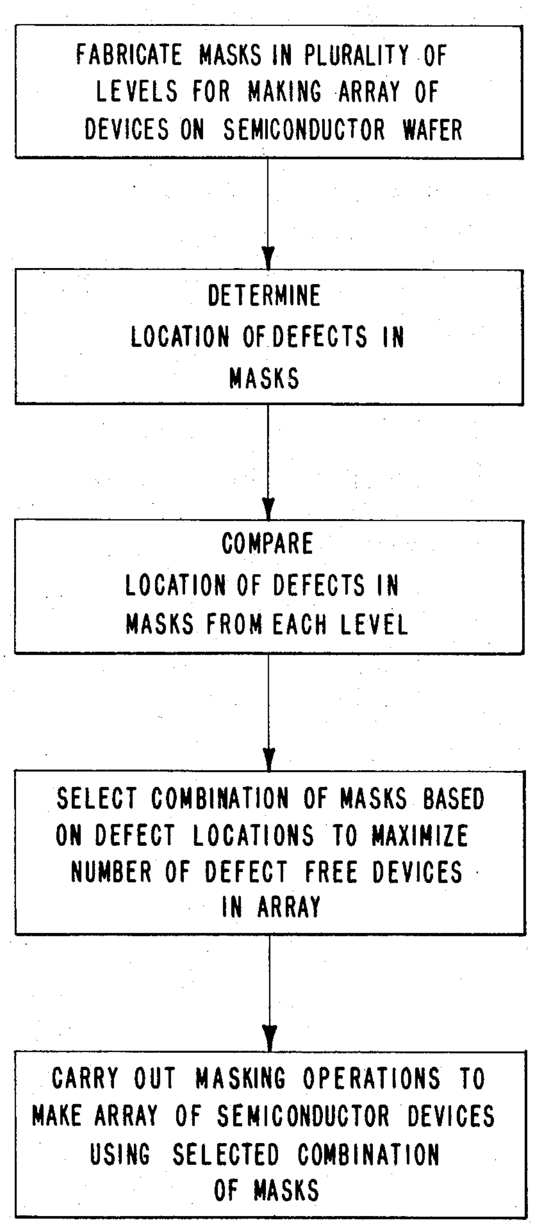
FIG. 1 is a flow diagram of the claimed process.

Referring now to the drawings, more particularly to FIG. 1, there is shown a flow diagram of a mask matching process, showing its basic steps. The first step is to fabricate masks in a plurality of levels for making an array of patterns on a substrate, such as integrated circuits on a semiconductor wafer. A number of masks for each level in the process are fabricated, so that a choice may be made of a particular mask to use in a given level. Reference is made to the above-cited co-pending Agusta et al. application Ser. No. 539,210, now Patent 3,508,209, FIGS. 8–17 thereof, for example of such masks. The masks there shown depict only one pattern in the array. The actual mask itself consists of an array containing a large number of the patterns shown.

As indicated in that application, the mask patterns shown are greatly enlarged. Fabrication of an array of these patterns in very small size (e.g., .06″ by .06″ each) is extremely difficult. In the fabrication of an array of such patterns, random defects occur which make the pattern defective where they occur. Consequently, semiconductor devices produced using the defective member of the array are themselves defective. The next step in the process is to determine the location of these random defects in the pattern areas on the masks fabricated in step one.

Once the location of the defects is known for the masks in each level, the location of the defects in masks from each level is compared as the third step in the process. This comparison will give the total number of defective semiconductor devices which would be produced as a result of mask defects with each combination of masks compared.

The fourth step in the process is to select a combination of masks based on their defect locations to maximize the number of patterns produced in the array which contain no defect. This may be done by selecting the mask combination having the highest number of array locations containing no defect in any of the mask levels. The result of this comparison and selection is to overlay the random defects in the masks as far as possible with a given number of masks for each level.

The final step in the process is to use the selected combination of masks for masking operations in the fabrication of an array of semiconductor devices. Matching the masks in this way to overlay defects as far as possible results in an increased number of defect-free semiconductor devices.

FIGS. 2 and 3 of the drawings show on a small scale the improvement that may be obtained using the claimed process as compared with the random use of masks. FIG. 2 shows the prior art random use of masks 10, 12, 14, and 16 containing two random defects 18 and seven non-defective pattern areas 20 each for four masking operations. The masks necessary to carry out the four masking operations are denoted A, B, C, and D, respectively. If the four masks 10, 12, 14, and 16 depicted were selected from a number for each level without any attempt to overlay defects, the use of these masks would produce seven defective integrated circuits out of a total of nine, as shown in the resulting composite 22 of pattern areas containing defects 18.

FIG. 3 shows three A level masks 24, 26, and 28; three B level masks 30, 32, and 34; three C level masks 36, 38, and 40; and three D level masks 42, 44, and 46. Each of these masks contain three random defects 18 in their nine patterns and six non-defective pattern areas 20. There are 81 different possible combinations of one A level mask, one B level mask, one C level mask, and one D level mask from those shown. Each of these combinations will produce a certain composite total number of patterns containing defects 18 in the nine patterns. Some of the different mask combinations are shown in FIG. 4. The combination of A mask 24, B mask 32, C mask 38, and D mask 46 produces composite defect pattern 48, shown in FIG. 3. This results in a total of four defective patterns out of the nine, which is the fewest number of defects that can be obtained using the masks depicted in FIG. 3. Therefore, that combination of masks is selected for use.

CARD EMBODIMENT

Figure 5:
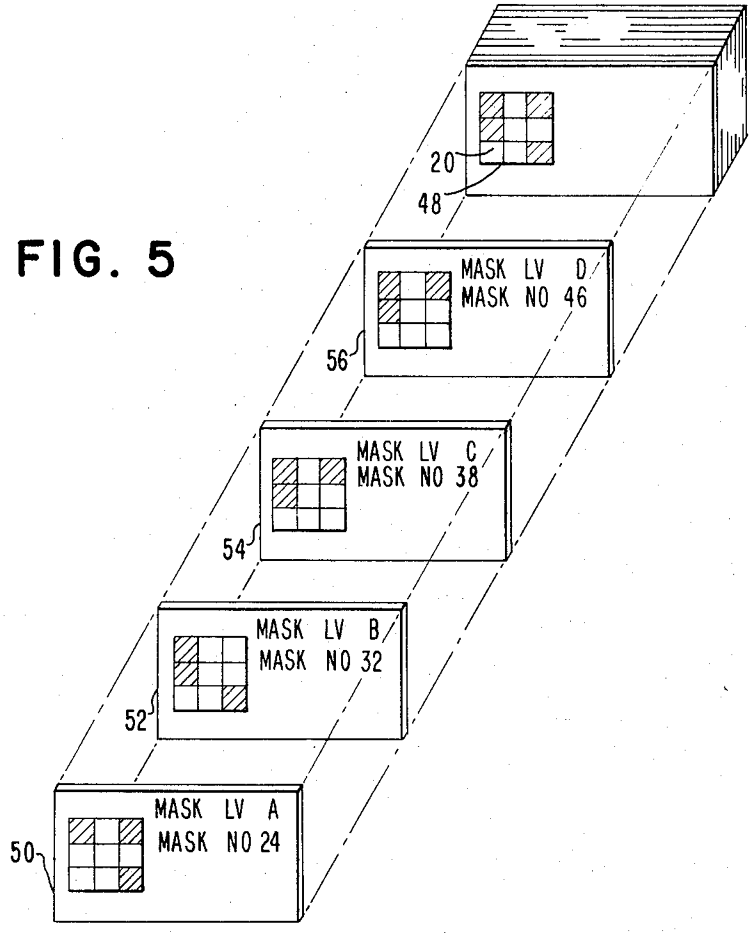
FIG. 5 shows the use of clear plastic cards to practice the invention.

FIG. 5 of the drawings shows how clear plastic cards with the defect pattern for the masks indicated on them may be used to obtain the composite defect pattern for each mask combination. As shown, plastic card 50 has the array locations containing defects in A level mask 24 marked out. Similiarly, plastic cards 52, 54, and 56 show the locations containing defects in B level mask 32, C level mask 38, and D level mask 46, respectively. These four plastic cards are overlayed as shown to give an indication of composite defect pattern 48 for these four masks.

For the masks shown in FIG. 3, there are 80 other composite defect patterns which may be indicated by overlaying plastic cards for one mask from each of the levels A–D in the same manner. When this is done, the combination of masks shown in FIG. 5 would be chosen for use in masking operations to make an array of semiconductor devices, since it has the largest number of non-defective array locations 220 in its composite defect pattern 48.

The comparison of the composite defect patterns 48 for each combination may be made visually. Alternatively, if the array locations on each mask containing defects 18 are marked out completely, the comparison may be made through use of a suitable photodetector to measure the amount of light transmitted through non-defective pattern areas 20 in composite 48.

If larger mask inventories than shown in FIG. 3 are involved, a very large number of different combinations of one mask from each level are possible. If, for example the number of masks for each level is increased to ten, the total number of different combinations would be ten thousand. Comparing all of these combinations through use of plastic cards would be quite difficult.

COMPUTER EMBODIMENT

Figure 6:
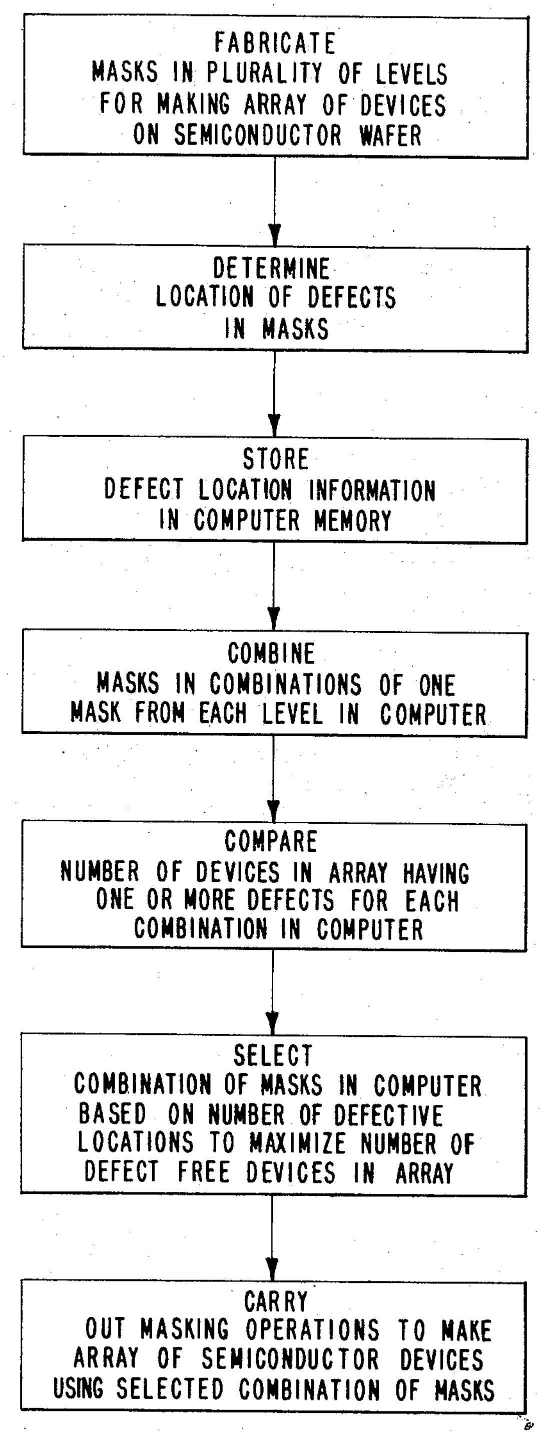
FIG. 6 is a flow diagram of an embodiment of the claimed invention using a computer to select the masks.

In order to handle larger numbers of masks at each level or more mask levels on a practical basis, a computer may be used to make the mask combinations and to compare the composite defect patterns. A flow diagram of a semiconductor manufacturing process in which a computer is used to compare the composite defect patterns of different mask combinations is shown in FIG. 6. In this process, masks in a plurality of levels for making an array of patterns on a substrate are fabricated. These masks are inspected to determine the location of defects in them. The resulting defect location information is stored in a computer memory. Through use of a suitable program, different combinations of one mask from each level are made in the computer. The number of patterns in the array containing one or more defects for each combination are compared in the computer.

Figure 7:
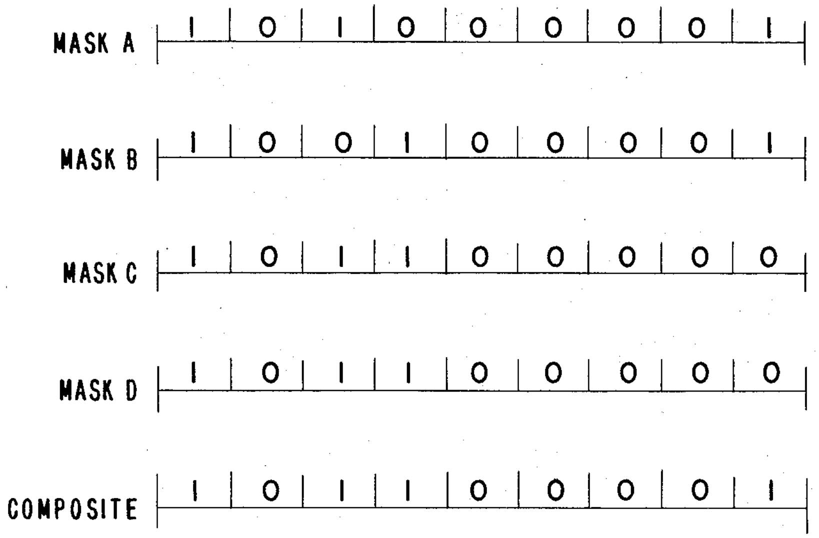
FIG. 7 represents how the selection is made by the computer in the embodiment of FIG. 6.

FIG. 7 is a representation of how the number of patterns containing one or more defects for each combination is obtained in the computer. The first four rows in FIG. 7 show the defect patterns for A mask 24, B mask 32, C mask 38, and D mask 46 as originally presented in FIG. 3. In FIG. 7, a defect-free location on the mask is indicated by a 0. A location containing a defect is indicated by a 1. To obtain the composite defect pattern indicated in column 5 of FIG. 7, the computer is instructed to carry out what is referred to as an "OR" operation. In this operation, the computer is instructed to write a 1 for an array location in the composite if a defect exists at that location in the A mask or the B mask or the C mask or the D mask. Carrying through for each of the nine array locations in the masks of FIG. 3, the composite defect pattern shown in FIG. 7 is obtained for the masks indicated. The composite defect patterns for the other mask combinations are obtained in the same manner. The computer then selects a combination of masks based on the number of defective locations in the composite defect patterns to maximize the number of defect-free patterns in the array. The masks so selected are then used to make an array of semiconductor devices on a wafer.

A refinement in the computer program allows the removal of the masks making the best combination from those used to make the different combinations. The remaining masks may then be combined in all possible ways to obtain the best combination of the remaining masks. Additional comparisons may be made, with removal of the best combination after each comparison. If desired, additional masks may be added for each level to replace the masks in the best combinations selected.

The following example illustrates the improvement in non-defective chip positions that can be obtained through practice of the invention.

Data for masks containing random defects in an array of 49 integrated circuits produced by seven different masking steps was used to obtain mask combinations in accordance with the invention, through use of a suitably programmed IBM 7090 computer. The data was for seven masks at each level.

The defect locations in the data for these seven masks at each level are shown in Table I, with the defect locations in the array in each case indicated by the numbers 1–49 for each array position. Column 1 gives the mask level, column 2 gives the mask numbers from each level, and column 3 gaves the defect locations.

TABLE I

| Level | Mask No. | Defect locations | | | | | | | | | | |
|---|---|---|---|---|---|---|---|---|---|---|---|---|
| A | 1 | 1 | 8 | 21 | 41 | 45 | 46 | 48 | | | | |
| A | 2 | 12 | 13 | 19 | 30 | 35 | 45 | 47 | 49 | | | |
| A | 3 | 2 | 22 | 25 | 26 | 29 | 30 | 38 | 40 | 41 | | |
| A | 4 | 2 | 14 | 23 | 28 | 31 | 36 | 37 | 46 | 48 | | |
| A | 5 | 3 | 4 | 9 | 29 | 32 | 34 | 41 | 43 | 44 | 46 | |
| A | 6 | 2 | 5 | 8 | 19 | 21 | 22 | 32 | 34 | 40 | 45 | |
| A | 7 | 3 | 10 | 14 | 22 | 26 | 29 | 31 | 32 | 43 | 45 | |
| B | 8 | 8 | 12 | 15 | 23 | 30 | 31 | 36 | 42 | | | |
| B | 9 | 1 | 4 | 6 | 8 | 11 | 18 | 22 | 23 | 39 | | |
| B | 10 | 4 | 7 | 13 | 21 | 25 | 29 | 32 | 40 | 42 | 49 | |
| B | 11 | 1 | 6 | 7 | 11 | 24 | 27 | 33 | 38 | 40 | 43 | |
| B | 12 | 1 | 5 | 10 | 16 | 18 | 19 | 27 | 29 | 33 | 40 | 47 |
| B | 13 | 6 | 11 | 15 | 16 | 19 | 20 | 28 | 29 | 34 | 41 | 43 |
| B | 14 | 6 | 8 | 10 | 16 | 19 | 21 | 22 | 28 | 33 | 44 | 47 |
| C | 15 | 19 | 24 | 40 | 43 | 46 | 49 | | | | | |
| C | 16 | 2 | 21 | 22 | 23 | 33 | 34 | 38 | 44 | 49 | | |
| C | 17 | 6 | 9 | 11 | 15 | 19 | 23 | 29 | 30 | 48 | 49 | |
| C | 18 | 7 | 21 | 24 | 25 | 28 | 37 | 39 | 45 | 46 | 48 | |
| C | 19 | 4 | 8 | 15 | 18 | 20 | 23 | 30 | 33 | 34 | 48 | |
| C | 20 | 5 | 7 | 9 | 11 | 15 | 17 | 23 | 42 | 48 | 49 | |
| C | 21 | 2 | 13 | 14 | 20 | 26 | 30 | 31 | 33 | 40 | 46 | |
| D | 22 | 1 | 4 | 21 | 28 | 32 | 35 | | | | | |
| D | 23 | 6 | 10 | 15 | 17 | 20 | 21 | 26 | 36 | 41 | 48 | |
| D | 24 | 4 | 9 | 23 | 28 | 37 | 42 | 43 | 45 | 46 | 47 | |
| D | 25 | 1 | 3 | 5 | 6 | 14 | 27 | 33 | 39 | 40 | 43 | 46 |
| D | 26 | 4 | 6 | 7 | 8 | 13 | 14 | 16 | 23 | 25 | 27 | 37 |
| D | 27 | 4 | 6 | 11 | 15 | 16 | 17 | 29 | 32 | 37 | 42 | 45 |
| D | 28 | 1 | 4 | 6 | 8 | 11 | 21 | 24 | 32 | 36 | 45 | 48 |
| E | 29 | 1 | 4 | 7 | 9 | 22 | 27 | 31 | 47 | | | |
| E | 30 | 1 | 11 | 15 | 17 | 22 | 31 | 33 | 37 | 44 | | |
| E | 31 | 2 | 5 | 7 | 12 | 17 | 21 | 30 | 31 | 45 | | |
| E | 32 | 2 | 5 | 24 | 28 | 35 | 37 | 41 | 43 | 46 | | |
| E | 33 | 5 | 8 | 9 | 10 | 15 | 18 | 24 | 33 | 37 | 40 | |
| E | 34 | 1 | 3 | 4 | 10 | 23 | 29 | 33 | 42 | 46 | 48 | |
| E | 35 | 5 | 8 | 12 | 22 | 28 | 29 | 30 | 33 | 36 | 38 | 49 |
| F | 36 | 2 | 6 | 23 | 29 | 43 | | | | | | |
| F | 37 | 2 | 12 | 14 | 19 | 27 | 49 | | | | | |
| F | 38 | 4 | 27 | 32 | 36 | 40 | 43 | 49 | | | | |
| F | 39 | 14 | 16 | 17 | 29 | 33 | 38 | 42 | 45 | | | |
| F | 40 | 1 | 8 | 10 | 23 | 25 | 29 | 30 | 36 | 38 | | |
| F | 41 | 10 | 17 | 18 | 20 | 21 | 23 | 36 | 39 | 46 | | |
| F | 42 | 1 | 2 | 3 | 9 | 12 | 22 | 29 | 34 | 44 | | |
| G | 43 | 8 | 12 | 43 | 45 | 47 | 49 | | | | | |
| G | 44 | 5 | 6 | 10 | 12 | 18 | 20 | 31 | 40 | 43 | | |
| G | 45 | 22 | 23 | 24 | 27 | 32 | 37 | 38 | 41 | 43 | 48 | |
| G | 46 | 5 | 8 | 12 | 13 | 14 | 16 | 22 | 37 | 39 | 44 | |
| G | 47 | 7 | 8 | 12 | 15 | 16 | 18 | 29 | 43 | 44 | 49 | |
| G | 48 | 2 | 4 | 10 | 12 | 13 | 19 | 20 | 29 | 32 | 41 | |
| G | 49 | 13 | 15 | 20 | 25 | 27 | 29 | 37 | 38 | 45 | 46 | 49 |

The computer was instructed to make all possible combinations of one mask from each level with the data in Table I, then choose the mask combination having the largest number of array positions with no defects in any of the mask levels. The computer was then instructed to remove this mask combination from the inventory of mask data for comparison, then repeat the combinations of one mask from each level with the remaining mask data to obtain a second best combination of masks. The two mask combinations selected are shown below in Table II.

TABLE II

| | Masks | | | | | | |
|---|---|---|---|---|---|---|---|
| | A | B | C | D | E | F | G |
| First selection | 4 | 8 | 15 | 24 | 32 | 37 | 43 |
| Second selection | 1 | 9 | 18 | 22 | 29 | 36 | 45 |

To show the improvement in defect-free positions obtained through use of the invention, the computer was instructed to carry out a random selection of one mask from each level from the seven masks for each level, with no attempt to match defect-containing positions in the array. The results obtained for the matched sets selected are shown below in Table III, together with the yield of defect-free circuits in the array if no attempt is made to match the masks.

TABLE III

| | No. of defects | Percent of array defect-free |
|---|---|---|
| Yield—matched sets: | | |
| First selection | 27 | 44.9 |
| Second selection | 29 | 40.8 |
| Yield—random use of masks | 40 | 18.4 |

The results show more than a doubled yield obtained by matching masks from the inventory of seven masks for each level, compared with the yield obtained from random mask selection. With a higher incidence of random defects in the masks, an even greater improvement in yield over random use of the masks would be obtained.

USE OF SELECTED MASKS

Figure 8:
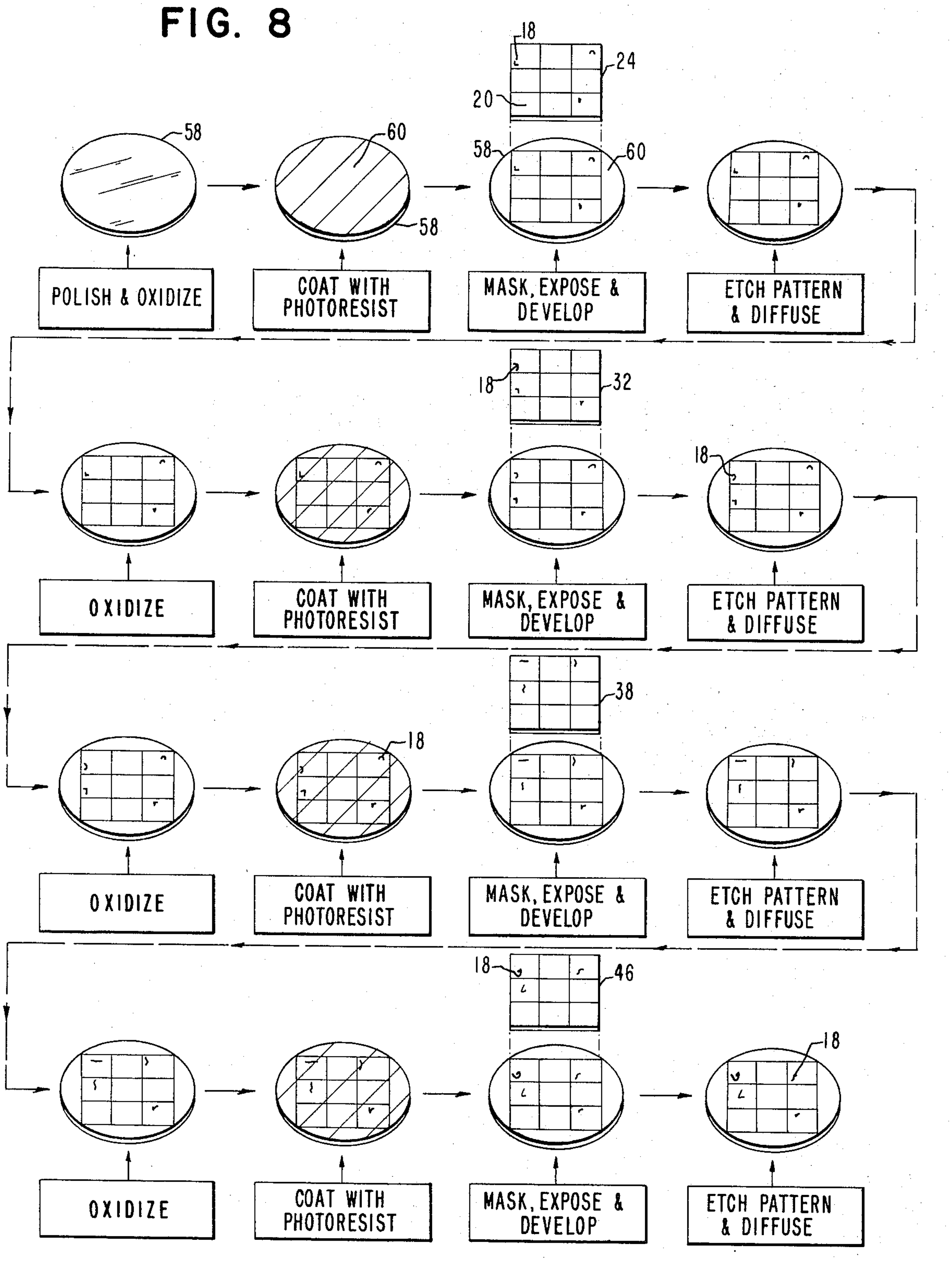
FIG. 8 shows the use of a combination of masks selected by the embodiment of FIG. 5 or the embodiment of FIGS. 6 and 7 to produce an array of semiconductor devices on a wafer.

FIG. 8 shows how the masks selected by either the card embodiment or the computer embodiment of the invention are used to make semiconductor devices on a wafer 58 of silicon or other semiconductor material. The wafer is first polished to a smooth surface and then oxidized. The oxidized wafer 58 is then coated with a layer of photoresist 60. An A level mask 24 containing a first pattern desired to be reproduced in the photoresist 60 is aligned on the surface of the photoresist coated wafer 58. The photoresist 60 is exposed to suitable light through the mask 24, then the photoresist is developed to remove either the exposed or unexposed areas, depending on whether a negative or positive photoresist is used. An etching operation is then carried out on the wafer 58. The photoresist 60 remaining on the surface of the wafer after the developing step prevents etching from taking place on the areas of the wafer covered by it. Defects 18 in the mask 24, as well as the desired pattern, are reproduced in the photoresist 60.

The etching operation removes the oxide layer from the wafer 58 in the areas not covered by photoresist 60 to expose elemental silicon. An impurity, such as boron, arsenic or phosphorus, may now be diffused into the elemental silicon to change its electrical conductivity characteristics.

As shown in FIG. 8, the oxidation, photoresist coating, masking, exposing, developing, etching, and diffusion steps are repeated utilizing B mask 32, C mask 38, and D mask 46 to produce desired effects in the wafer 58. In addition to or as alternatives to the four diffusion steps shown in FIG. 8, other processing operations on the elemental silicon exposed by the etching process may be carried out, such as epitaxial growth of silicon. Also, masks selected in accordance with the invention may be used to produce other types of patterns on the semiconductor wafer, such as aluminum conducting lines joining individual monolithic components in the circuits being produced. For further details on such monolithic integrated structure fabrication processes, reference is made to the above mentioned co-pending Agusta et al. application.

It should now be apparent that a process for producing integrated circuits on a semiconductor wafer or other patterns on a substrate capable of carrying out the stated objects of the invention has been provided. Matching the masks used to produce such patterns in accordance with this invention increases the number of defect-free patterns that can be produced without increasing either the quality of the masks used or the number of masking operations. Alternatively, an acceptable yield of such patterns can be obtained using lower quality masks than hitherto possible. By maintaining information on possibly defective locations in the masks throughout the manufacturing process, an invaluable assist in determining whether such locations actually are defective is provided. Finally, a way of determining whether particular defective patterns are produced by defective masks or by the processing operations carried out is provided.

While the invention has been particularly shown and described with reference to preferred embodiments thereof, it will be understood by those skilled in the art that various changes in form and details may be made therein without departing from the spirit and scope of the invention.

What is claimed is:

1. A process for producing an array of integrated circuits on a semiconductor substrate, using a plurality of masks of different types in a set to define parts of each integrated circuit in successive processing steps, the integrated circuits being subject to randomly occurring defects caused by random defects in the masks, comprising:

(a) fabricating a number of masks of each type,
(b) determining the location of defects in the masks of each type,
(c) comparing the location of the defects in masks of each type,
(d) selecting a combination of a mask of each type to maximize the total number of defect-free integrated circuits produced by use of the selected combination of masks, and
(e) using a mask from the selected combination to define successively a part of each integrated circuit in a light-responsive pattern defining medium in each of said successive processing steps.

2. The process of claim 1 wherein the semiconductor substrate is a silicon wafer and the array of patterns is a plurality of essentially identical integrated circuits.

3. The process of claim 1 wherein the light-responsive pattern defining medium is photoresist.

4. A process for the manufacture of an array of monolithic integrated circuits on a semiconductor wafer using masks to define areas of each circuit in a plurality of successive processing steps, comprising:

(a) fabricating a number of masks for each processing step,
(b) inspecting the masks to determine the location of defects thereon,
(c) recording the location of the mask defects;
(d) comparing the location of the mask defects in masks for the plurality of processing steps,
(e) selecting a particular combination of masks for the plurality of processing steps which will minimize the number of defective integrated circuits produced in the array,
(f) using a first mask from the selected combination of masks to define an area of each circuit in the array in a light-responsive pattern defining medium,
(g) carrying out the remainder of a first processing step for the circuits, and
(h) using a mask from the selected combination to define successively each remaining area of the circuits in a light-responsive pattern defining medium for each remaining successive processing step.

5. The process of claim 4 wherein the location of mask defects is compared by making different combinations of one mask for each processing step and observing the total number of integrated circuit positions in the array which contain at least one mask defect for each different combination of masks.

6. The process of claim 5 wherein the semiconductor wafer is silicon and the monolithic integrated circuits in the array are essentially identical.

7. The process of claim 5 wherein the masks for each processing step are combined in all possible combinations of one mask for each processing step and the combination producing the greatest number of integrated circuits in the array having no mask defects is selected for use to make the array of monolithic integrated circuits.

8. A process for preparing an array of monolithic integrated circuits on a semiconductor wafer, using a plurality of masks in successive processing steps to define parts of the integrated circuits, the integrated circuits being subject to randomly occurring defects caused by random defects in the masks, comprising:

(a) fabricating a number of masks for each processing step,
(b) inspecting each mask to determine which random positions in the array contain defects in the masks,
(c) recording the random defects for each mask on a suitable recording medium,
(d) comparing the location of mask defects in masks for the plurality of processing steps,
(e) selecting a particular combination of masks for the plurality of processing steps which will maximize the number of defect-free integrated circuits produced by the successive process steps,
(f) coating the semiconductor wafer with a photoresist,
(g) using a first mask from the selected combination to expose the photoresist,
(h) carrying out the remainder of a first processing step on the semiconductor wafer,
(i) coating the semiconductor wafer with photoresist a second time,
(j) using a second mask from the selected combination to expose the photoresist,
(k) carrying out the remainder of a second processing step on the semiconductor wafer, and
(l) continuing the plurality of processing steps on the semiconductor wafer using the remaining masks from the selected combination to expose photoresist on the semiconductor wafer.

References Cited

UNITED STATES PATENTS

| | | | |
|---|---|---|---|
| 3,245,794 | 4/1966 | Conley | 96—36.2 |
| 3,317,320 | 5/1967 | Reber | 96—36.2 |
| 3,385,702 | 5/1968 | Koehler | 96—44 |
| 3,508,209 | 4/1970 | Agusta et al. | 340—173 |

MURRAY KATZ, Primary Examiner

U.S. Cl. X.R.

96—44; 117—5.5, 212; 29—574, 576, 577; 340—173R